(12) United States Patent
Claeys et al.

(10) Patent No.: US 8,592,883 B2
(45) Date of Patent: Nov. 26, 2013

(54) SEMICONDUCTOR STRUCTURE AND METHOD FOR MAKING SAME

(75) Inventors: Dieter Claeys, Kallmuenz (DE); Bernd Eisener, Hohenbrunn (DE); Guenter Pfeifer, Pentling (DE); Detlef Wilhelm, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/233,038

(22) Filed: Sep. 15, 2011

(65) Prior Publication Data
US 2013/0069198 A1   Mar. 21, 2013

(51) Int. Cl.
*H01L 27/108*   (2006.01)

(52) U.S. Cl.
USPC ........... 257/303; 257/297; 257/302; 257/304; 257/316; 257/329; 438/242; 438/245; 438/246; 438/248; 438/253

(58) Field of Classification Search
None
See application file for complete search history.

(56) References Cited

U.S. PATENT DOCUMENTS 6,544,831 B2 *   4/2003   Kunikiyo ................. 438/238
6,590,249 B2 *   7/2003   Kusters et al. ............ 257/301

* cited by examiner

*Primary Examiner* — Kyoung Lee
(74) *Attorney, Agent, or Firm* — Infineon Technologies; Philip H. Schlazer

(57) ABSTRACT

An embodiment may be a semiconductor structure, comprising; a workpiece having a front side and a back side; and a capacitor disposed in the workpiece, the capacitor including a bottom electrode electrically coupled to a back side of said workpiece. In an embodiment, the bottom electrode may form a conductive pathway to the front side of the workpiece. In an embodiment, the capacitor may be a trench capacitor.

18 Claims, 11 Drawing Sheets

SEMICONDUCTOR STRUCTURE AND METHOD FOR MAKING SAME

FIELD OF THE INVENTION

One or more embodiments of the present invention relate to semiconductor structures and method for making semiconductor structures.

BACKGROUND OF THE INVENTION

Capacitors may be a part of semiconductor structures. For example, capacitors may be part of semiconductor chips, integrated circuits or semiconductor devices. Examples of capacitors include, but not limited to, stacked capacitors, metal-insulator-metal (MIM) capacitors, trench capacitors and vertical-parallel-plate (VPP) capacitors. New capacitor structures are needed.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1A:
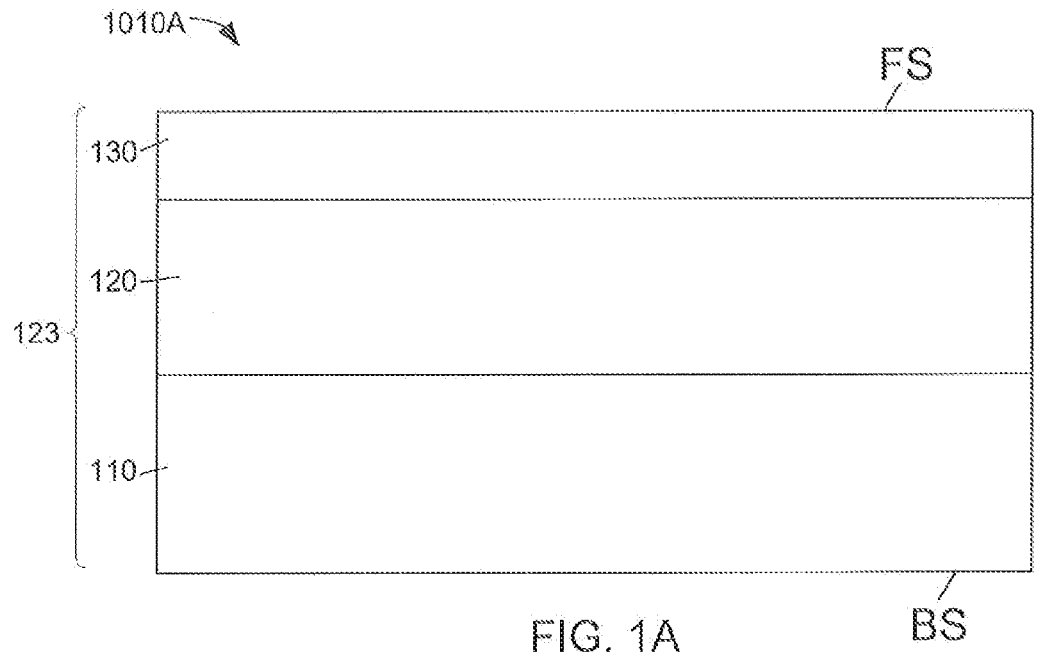
FIGS. 1A through 14 show a method of making a semiconductor structure in accordance with an embodiment of the present invention.

FIG. 1A shows a semiconductor structure 1010A which is an embodiment of the present invention. The structure 1010A includes a first semiconductor layer 110. A second semiconductor layer 120 is formed over the first semiconductor layer 110. A third semiconductor layer 130 is formed over the second semiconductor layer 120.

The layers 110, 120, 130 form a layer stack 123. In the embodiment shown, the layer stack 123 has a front or top side FS as well as a back or bottom side BS. The front side FS may correspond to a top surface of the layer 130. The back side BS may correspond to the bottom surface of the layer 110. In another embodiment, it is possible that the layer stack include only one or two layers. In another embodiment, it is possible that the layer stack include more than three layers.

In another embodiment it is possible that the layer stack 123 be replaced with any other type of workpiece. In an embodiment, the workpiece may be a semiconductor workpiece. In an embodiment, the workpiece may be a layer stack that includes two or more layers. In an embodiment, the workpiece may be a layer stack that includes three of more layers.

In one or more embodiments, the first semiconductor layer 110 may be a doped semiconductor layer. In one or more embodiments, the first semiconductor layer 110 may be a p-doped semiconductor layer or an n-doped semiconductor layer. In an embodiment, the first semiconductor layer 110 may be a p-doped semiconductor layer. The first semiconductor layer 110 may, for example, be a $p^+$ (p plus) doped semiconductor layer or a $p^{++}$ (p plus plus) doped semiconductor layer. The first semiconductor layer 110 may, for example, be boron doped so as to form a p-type semiconductor layer.

In an embodiment, the first semiconductor layer 110 may have a resistivity of about 50 micro-ohm cm or less. In an embodiment, the first semiconductor layer 110 may have a resistivity of about 30 micro-ohm cm or less. In an embodiment, the first semiconductor layer 110 may have a resistivity of about 20 micro-ohm cm or less. In an embodiment, the first semiconductor layer 110 may be a semiconductor substrate such as a bulk semiconductor substrate. In an embodiment, the first semiconductor layer 110 may be a silicon substrate such as a bulk silicon substrate. In an embodiment, the first semiconductor layer 110 may be a monocrystalline silicon layer.

It is noted that, in an embodiment, the first semicondutor layer may be sufficiently doped to become a conductive material (e.g. electrically conductive).

It is noted that, in an embodiment, the first semiconductor layer 110 may be an n-type semiconductor layer such as an $n^+$ (n plus) layer or an $n^{++}$ (n plus plus) layer.

In an embodiment, the second semiconductor layer 120 may be a doped semiconductor layer. In one or more embodiments, the second semiconductor layer 120 may be a p-doped semiconductor layer or an n-doped semiconductor layer. In an embodiment, the second semiconductor layer 120 may have the same conductivity type as the first semiconductor layer 110. In an embodiment, the second semiconductor layer 120 may be p-type semiconductor layer. In an embodiment, the second semiconductor layer 120 may be a $p^-$ (p minus) doped semiconductor layer. The second semiconductor layer 120 may be boron doped so as to form a p-type semiconductor layer. In an embodiment, the dopant concentration of the second semiconductor layer 120 may be less than that of the first semiconductor layer 110. The second semiconductor layer 120 may have a resistivity which is greater than that of the first semiconductor layer 110. The second semiconductor layer 120 may have a resistivity of about 10 ohm-cm or greater. The second semiconductor layer 120 may have a resistivity of about 15 ohm-cm or greater. The second semiconductor layer 120 may have a resistivity of about 18 ohm-cm or greater. The second semiconductor layer may be an epitaxial layer that is formed over (e.g. directly on) the first semiconductor layer. The epitaxial layer may be formed by a deposition process. In an embodiment, the second semiconductor layer may comprise silicon such as monocrystalline silicon.

It is noted that, in an embodiment, the second semiconductor layer may be an n-doped layer such as an $n^-$ (n minus) doped semiconductor layer.

In an embodiment, the third semiconductor layer 130 may be a doped semiconductor layer. In one or more embodiments, the third semiconductor layer 130 may be a p-doped semiconductor layer or an n-doped semiconductor layer. In an embodiment, the third semiconductor layer 130 may have a conductivity type which is opposite to that of the first semiconductor layer 110. In an embodiment, the third semiconductor layer 130 may have a conductivity type which is opposite to that of the second semiconductor layer 120. In an embodiment, the third semiconductor layer 130 may be n-type. In an embodiment, the dopant concentration of the third semiconductor layer 130 may be less than that of the first semiconductor layer 110. In an embodiment the dopant concentration of the third semiconductor layer may be less than that of the second semiconductor layer. As an example, the third semiconductor layer 130 may be an n⁻ (n minus) doped layer. The third semiconductor layer 130 may be an epitaxial layer which is formed over (e.g. directly on) the second epitaxial layer. For example, the third semiconductor layer 130 may be a collector epitaxial layer. The third semiconductor layer 130 may have a thickness of about 3 micron or less. In an embodiment, the third semiconductor layer 130 may have a thickness of about 2 microns or less. In an embodiment, the third semiconductor layer 130 may have a thickness of about 1.2 microns. In an embodiment, the third semiconductor layer 130 may comprise silicon such as monocrystalline silicon.

It is noted that, in an embodiment, the third semiconductor layer 130 may be a p-type semiconductor layer such as a p⁻ (p minus) doped semiconductor layer.

It is noted that, in an embodiment, an epitaxial layer may be formed by a chemical vapor depostion process. A possible example of a process is vapor phase epitaxy. Other methods may also be used.

Referring to FIG. 1A, in one or more embodiments, the layer 110 may be a p-doped semiconductor layer such as a p⁺ (p plus) doped semiconductor layer or a p⁺⁺ (p plus plus) doped semiconductor layer, the layer 120 may be a p-doped semiconductor layer such as a p⁻ (p minus) doped semiconductor layer, and also the layer 130 may be an n-doped semiconductor layer such as an n⁻ (n minus) doped semiconductor layer.

Figure 1B:
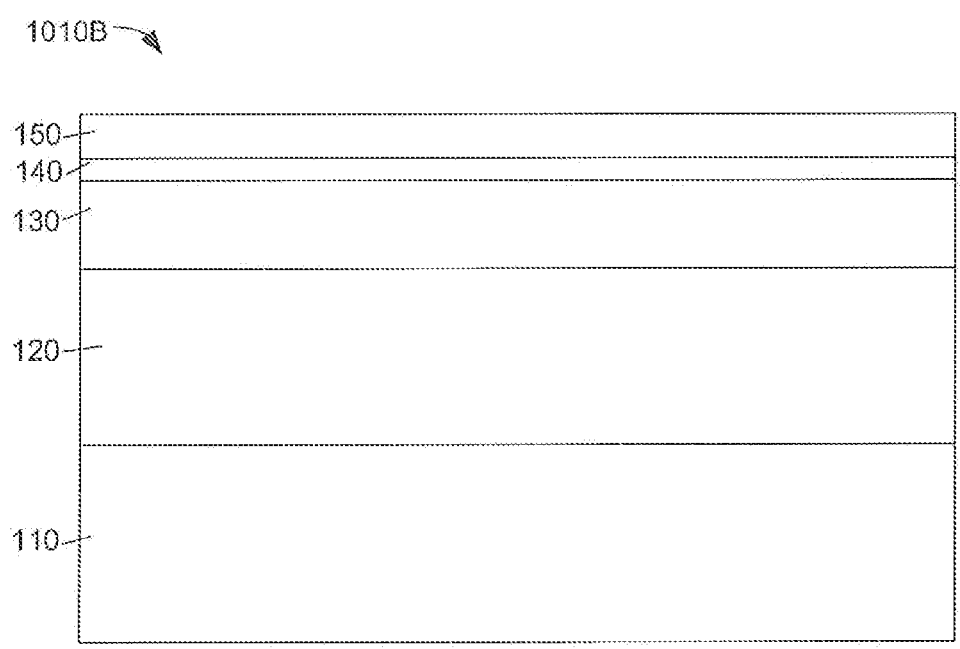

FIG. 1B shows a structure 1010B. A dielectric layer 140 is formed over the third semiconductor layer 130. A dielectric layer 150 is formed over the dielectric layer 140. Dielectric layer 140 may comprise any dielectric material. In an embodiment, the dielectric layer 140 may, for example, comprise an oxide, a nitride or an oxynitride. In an embodiment, the dielectric layer 140 may comprise a nitride such as a silicon nitride. The dielectric layer 140 may be a nitride layer.

Dielectric layer 150 may comprise any dielectric material such as an oxide, a nitride or an oxynitride. In an embodiment, the dielectric layer 150 and the dielectric layer 140 may comprise a different dielectric material. In an embodiment, the dielectric layer 150 may comprise an oxide such as silicon dioxide. The dielectric layer 150 may be an oxide layer.

Figure 2:
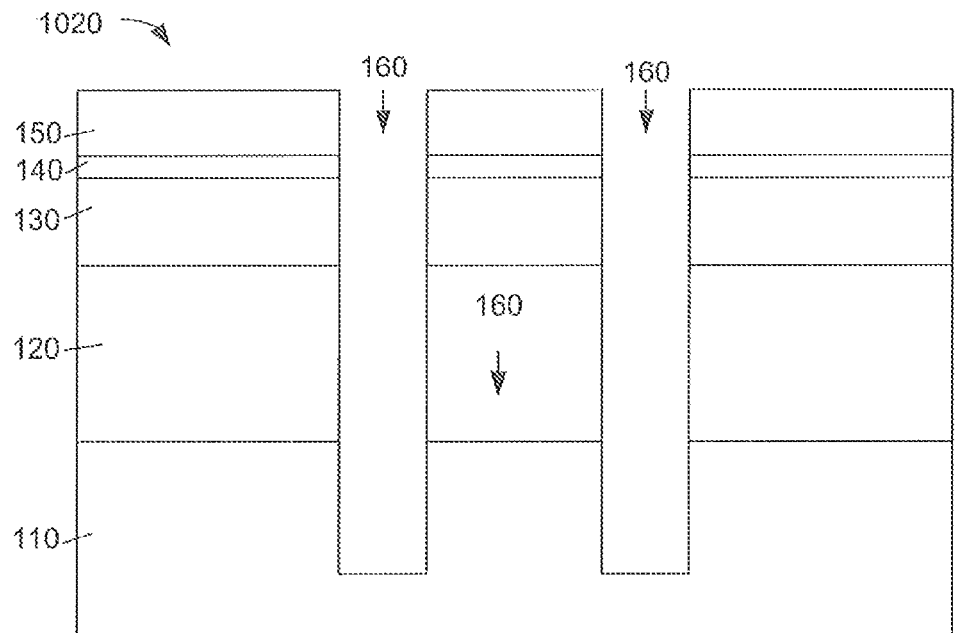

The dielectric layers 140, 150 may serve as a hard mask for the following etch to form openings 160 as shown in FIG. 2.

Referring to FIG. 2, openings 160 (for example, trenches) may be formed in the structure 1010B from FIG. 1B to form the structure 1020 of FIG. 2. The openings 160 may be formed in the dielectric layer 150, in the dielectric layer 150, in the third semiconductor layer 130, in the second semiconductor layer 120, in the first semiconductor layer 110. The openings 160 may be formed fully through the dielectric layer 150, fully through the dielectric layer 140, fully through the third semiconductor layer 130, fully through the second semiconductor layer 120 and partially through the first semiconductor layer 110. However, in another embodiment, the openings 160 may be formed fully through the first semiconductor layer 110. In an embodiment, openings 160 may have a depth of about 10 micron or more. In an embodiment, the openings 160 may have a depth of about 12 microns or more. In an embodiment, the openings 160 may have a depth of about 15 microns or more.

The openings 160 may be formed by placing a masking layer over the dielectric layer 150 and patterning the masking layer. The masking layer may be a photoresist layer. The pattern from the masking layer may then be transferred to the dielectric layers 140, 150. The dielectric layer 140 and/or the dielectric layer 150 may be used as a hard mask to form the openings 160 in the remaining layers 110, 120, 130.

In the embodiment shown, two openings 160 are formed which are spaced apart from each other (e.g. laterally spaced apart from each other). In other embodiments, more than two openings may be formed which are spaced apart from each other (e.g. laterally spaced apart from each other). Hence, a plurality of openings 160 may be formed. In another embodiment, only a single opening 160 may be formed.

The openings 160 may have any lateral cross sectional shape. Each opening 160 may have one or more sidewall surfaces. Each opening 160 may have a bottom surface. The lateral cross sectional shape may have a length and width such that the length is greater than the width. In the embodiment shown in FIG. 2, the widths of the openings 160 may be parallel to the plane of the paper while the lengths of the openings 160 may be perpendicular to the plane of the paper. The lengths of the openings 160 may be parallel to each other. In an embodiment, the lengths may be longer than the widths. In an embodiment, the openings 160 may be formed as trenches. In an embodiment, the openings 160 may be formed as holes. The openings 160 may be formed using an etch process. The etch process may be a dry etch process.

Figure 3:
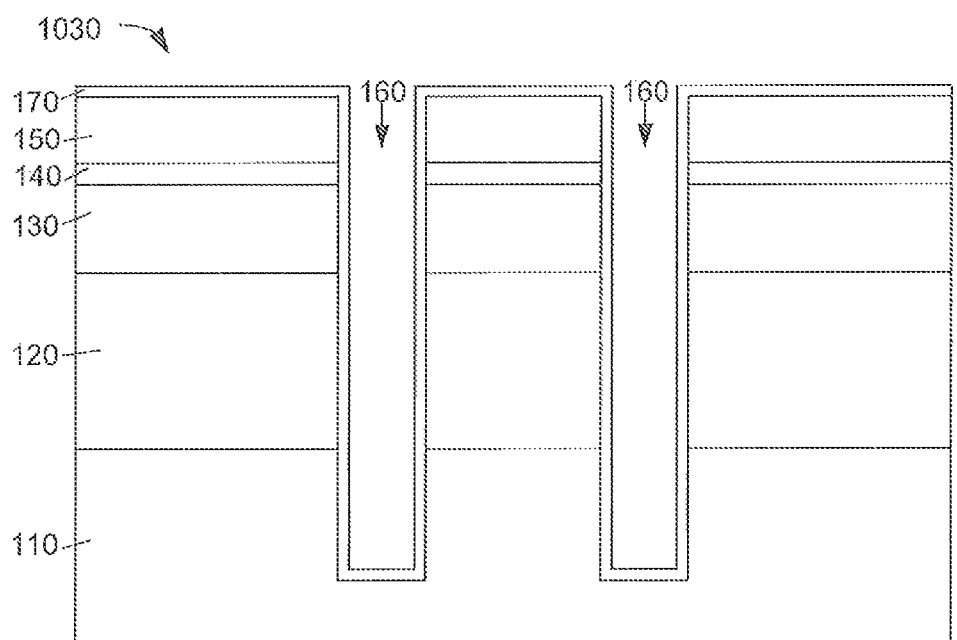

Referring to FIG. 3, a layer 170 may be formed over the top surface of structure 1020 from FIG. 2 to form the structure 1030 of FIG. 3. The layer 170 may be a doped layer 170. The doped layer 170 may, for example, be a p-doped layer or an n-doped layer. The doped layer 170 may be formed over the top surface of semiconductor layer 150 as well as within the openings 160. The doped layer 170 may be formed over the sidewall and bottom surfaces of each of the openings 160. In an embodiment, the conductivity type of the doped layer 170 may be the same as the conductivity type of the first semiconductor layer 110. In an embodiment, the doped layer 170 may be a doped dielectric layer. In an embodiment, the doped layer 170 may be a doped glass layer. In an embodiment, the doped layer 170 may be a doped silicon glass layer. In an embodiment, the doped layer 170 may be a p-doped layer such as a p-doped silicon glass layer. The p-doped silicon glass layer may be a boron doped silicon glass (e.g. BSG). The BSG may include at least about 3% boron. The BSG may include at least about 5% boron. The BSG may include between about 3% and about 10% boron. The BSG may include about 6% boron. The doped layer 170 may be formed using a PECVD process. The thickness of the doped layer 170 may between about 150 nm and about 250 nm. In an embodiment, the thickness of the doped layer 170 may be about 200 nm.

It is noted that, in an embodiment, the doped layer 170 may be an n-doped layer such as an n-doped silicon glass. The n-doped silicon glass may be an arsenic-doped silicon glass or a phosphorous-doped silicon glass.

Figure 4:
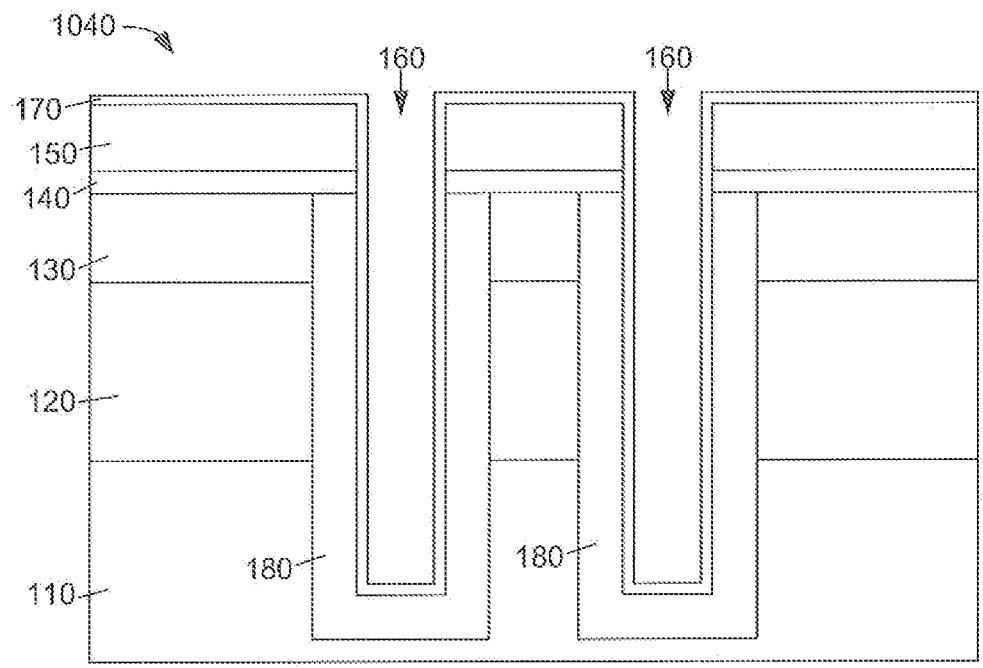

Referring to FIG. 4, a region 180 may be formed about each of the openings 160 so as to form the structure 1040. The regions 180 may be doped regions 180. The doped regions 180 may be formed by the out-diffusion of the dopant from the doped layer 170 and into the semiconductor layers 110, 120 and 130 (e.g. into silicon such a monocrystalline silicon). The out-diffusion may be accomplished by application of one or more thermal annealing processes. In an embodiment, the regions 180 may be conductive regions (e.g. electrically conductive regions).

It is noted that each of the doped regions 180 may be viewed as being formed about the sidewall and bottom surfaces of an opening 160. Each of the doped regions 180 may border the sidewall and bottom surfaces of an opening 160.

Likewise, each of the doped regions 180 may surround a respective opening 160 (for example, laterally about the sidewall(s) of a respective opening 160 as well about the bottom of a respective opening). It is again noted that the lateral cross-section of each of the openings 160 may have any shape including, but not limited to round, square, rectangular and elongated. The lateral cross-section of each of the openings may, for example, have a length and a width where the length is greater than the width. In an embodiment, the length may be directed into the page. In an embodiment, each of the openings 160 may also be deeper than wide. In an embodiment, the lateral cross-section of an opening 160 may be elongated. In other embodiments, the lateral cross-section of an opening 160 may, for example, be a circle or a square. In another embodiment, an opening 160 may have a lateral cross-section wherein the length is the same as the width (for example, a square or a circle).

In an embodiment, the doped layer 170 may be a boron doped silicon glass layer which may serve as a diffusion source of boron into the semiconductor layers 110, 120 and 130 so as to form the boron doped regions 180. Hence, in an embodiment, the doped regions 180 may be p-doped regions. In another embodiment, it is possible that the doped regions 180 be n-doped regions. In one or more embodiments, The doped regions 180 may be conductive regions (e.g. conductive layers). In one or more embodiment, regions 180 may be formed which are conductive regions which may be formed in any way (for example, with doping or by any other means).

In one or more embodiments, after the drive-in step to form the doped regions 180, an optional additional diffusion may reduce the boron concentration at the outward-facing surfaces of the doped regions 180. This may be useful because a very high boron concentration may force high oxidation rates and may lead to a reduced capacitance.

Figure 5:
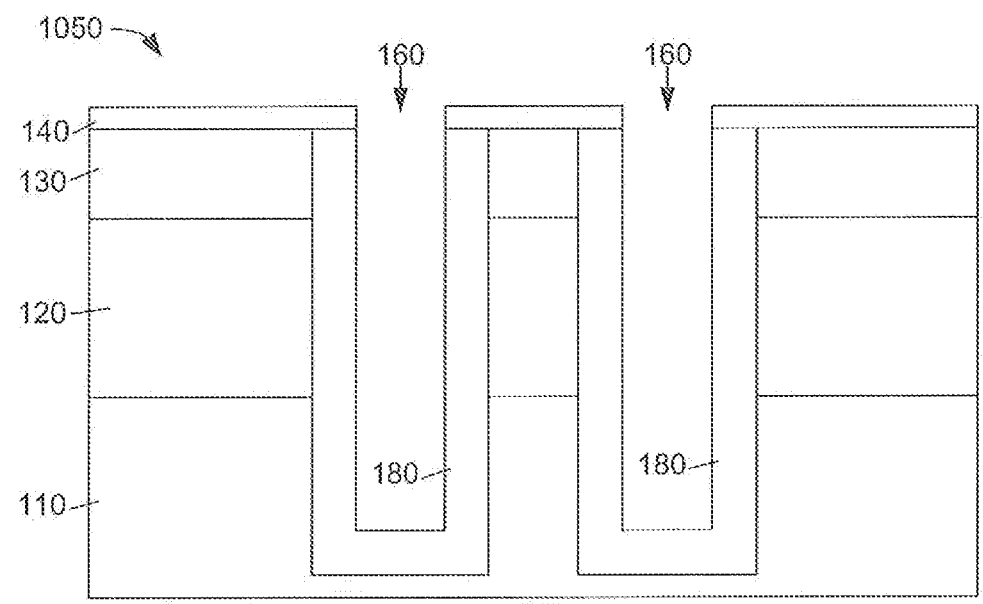

Referring to FIG. 5, the dielectric layer 150 and the doped layer 170 may be removed to form the structure 1050. In one or more embodiments, a wet etching process may be used to remove the doped layer 170 as well as the dielectric layer 150.

Figure 6:
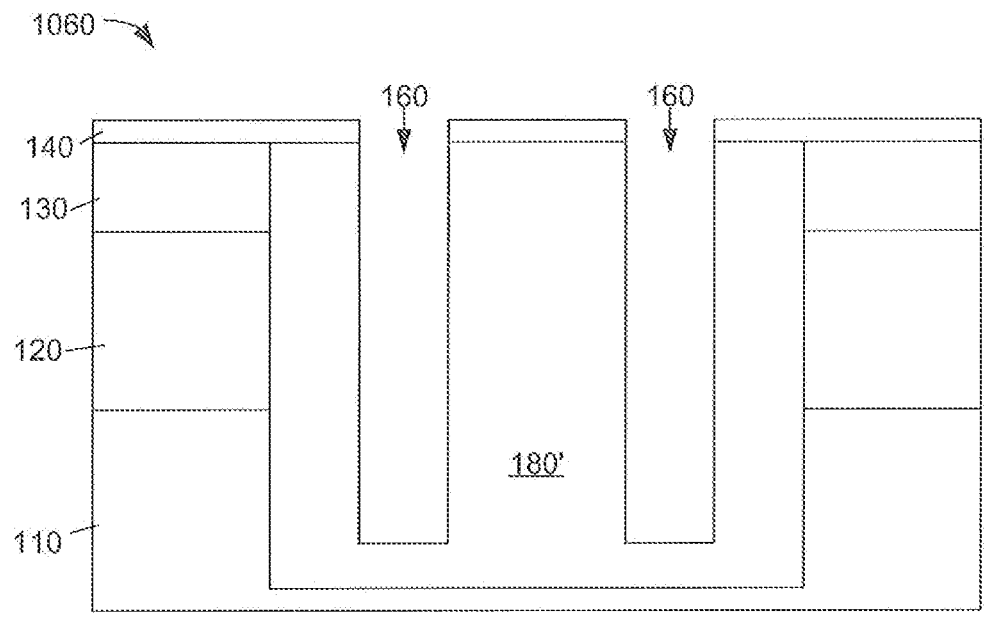

Referring to FIG. 6, one or more drive-in steps may be used to diffuse the dopant (for example, boron) further into the semiconductor layers 110, 120 and 130 so as to form the doped region 180' (which may, for example, be a boron doped region). Each drive-in step may be accomplished by one or more annealing processes. In an embodiment, the doped region 180' may be a single continuous region because the individual doped regions 180 (as, for example, shown in FIG. 5) may have sufficiently diffused so as to make contact with each other. Hence, each of the individual doped regions 180 shown in FIG. 5 may diffuse together to form a single continuous doped region 180'. The doped region 180' extends between the openings 160. In one or more embodiments, the doped region 180' may be sufficiently doped to be a conductive region. Hence, in one or more embodiments, doped region 180' may be a conductive region. Also, in other embodiments, it is possible that the doped material of region 180' be replaced by some other material which is conductive.

It is noted that the doped region 180' may surround each of the openings 160 (laterally about the sidewall(s) of the openings 160 as well as on the bottom of each of the openings 160).

The doped region 180' may be electrically coupled to the semiconductor layer 110. The doped region 180' may extend into the first semiconductor layer 110. Hence, the doped region 180' may extend at least partially through the first semiconductor layer 110. In an embodiment, the doped region 180' may extend partially through the first semiconductor layer 110. In another embodiment, the doped region 180' may extend fully through the first semiconductor layer 110.

In another embodiment, it may be possible that the doped region 180' may extend fully through the second semiconductor layer 120. In an embodiment, the doped region 180' may extend fully through the third semiconductor layer 130.

In an embodiment, the doped region 180' may form a conductive pathway (e.g. electrically conductive pathway) through the third semiconductor layer 130, through the second semiconductor layer 120 and may additionally be electrically coupled to the first semiconductor layer 110. In one or more embodiments, an electrical connect may be formed from the doped region 180' to the bottom surface of the first semiconductor layer 110 (e.g. to the back end BS of the stack 123 shown in FIG. 1A). The electrical connection may be accomplished through the material of the first semiconductor layer 110. For example, in one or more embodiment, the first semiconductor layer 110 may be sufficiently doped to be a conductive material.

In an embodiment, the doped region 180' may be a p-type region. In another embodiment, it is possible that the doped region 180' be an n-doped region. In an embodiment, the doped region 180' may form an electrical pathway (e.g. a conductive pathway) which extends from a top surface of the third semiconductor layer 130 (e.g. from the front side FS of the stack shown in FIG. 1A) to the first semiconductor layer 110. The electrical pathway may, for example, be a sinker connection. The doped region 180' may be electrically coupled to the first semiconductor layer 110. In one or more embodiments, the first semiconductor layer 110 may provide a conductive pathway (e.g. an electrically conductive pathway) from the doped region 180' to the bottom surface of the first semiconductor layer 110 (e.g. to the back end BS of the stack 123 shown in FIG. 1A). Hence, in one or more embodiments, the front side FS of the stack shown in FIG. 1A may be electrically coupled to the back side BS as shown in FIG. 1A.

In an embodiment, the first and second semiconductor layers 110, 120 may be of a first conductivity type while the third semiconductor layer 130 may be a second conductivity type opposite to that of the first conductivity type. The second semiconductor layer 120 may have a dopant concentration which is less that the first semiconductor layer 110.

In an embodiment, the first semiconductor layer 110 may be a p-type layer such as highly doped p-type layer (such as a $p^+$ layer or a $p^{++}$ layer). In an embodiment, the second semiconductor layer 120 may be a p-type layer such as a p– layer. In an embodiment, the third semiconductor layer 130 may be an n-type layer. In an embodiment, the first semiconductor layer 110 may be an n-type layer such as highly doped n-type layer (such as an $n^+$ layer or an $n^{++}$ layer). In an embodiment, the second semiconductor layer 120 may be an n-type layer such as an n– layer. In an embodiment, the third semiconductor layer 130 may be a p-type layer. FIG. 6 shows structure 1060.

Figure 7:
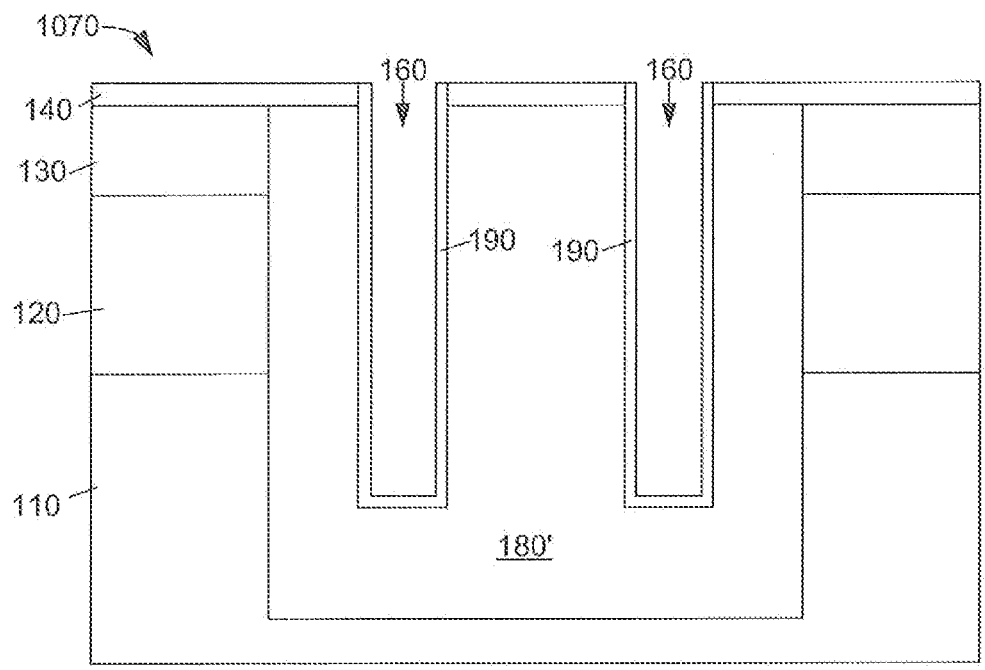

Referring to FIG. 7, after optionally cleaning of the openings 160, a dielectric layer 190 may be formed over the sidewall and bottom surfaces of the openings 160. The dielectric layer 190 may comprise a stack of a plurality of sub-layers such as an oxide-nitride-oxide (e.g. ONO) stack of sub-layers. In an embodiment, the dielectric layer 140 may still be in place during the formation of the dielectric layer 190. FIG. 7 shows the structure 1070.

Figure 8:
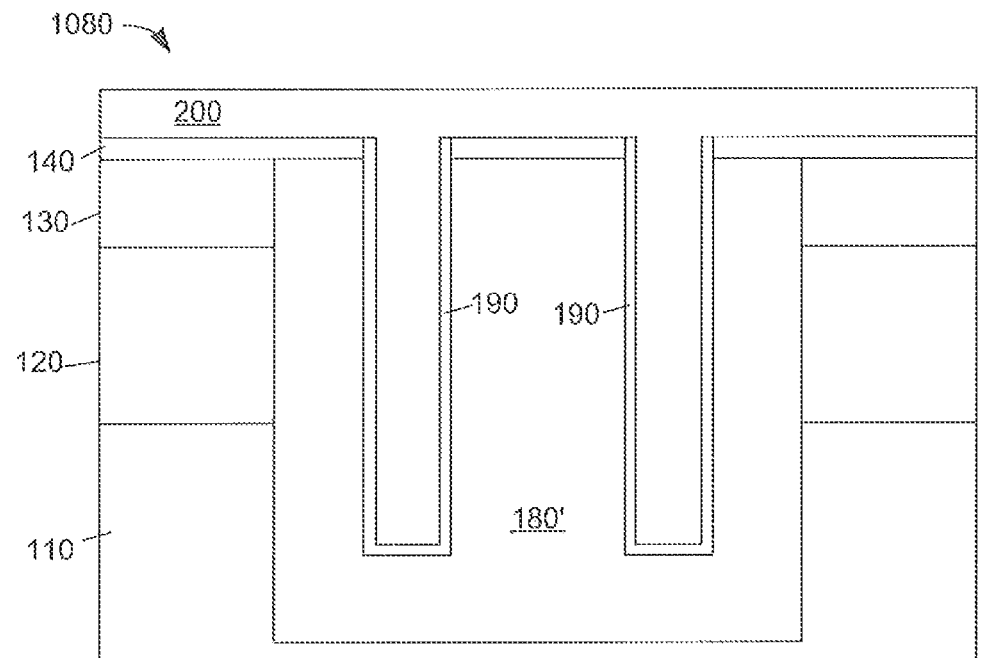

Referring to FIG. 8, a conductive layer 200 may then be formed over the structure 1070 from FIG. 7 to form the structure 1080 shown in FIG. 8. For example, a conductive layer 200 may be formed over the top surface of the dielectric layer 140 as well as within the openings 160. The conductive layer 200 may be formed over the dielectric layer 190 that is within the openings 160. FIG. 8 shows the structure 1080.

The conductive layer 200 may comprise a doped polysilicon. The doped polysilicon may be n-type doped or p-typed doped. The doped polysilicon may be doped in-situ. In another embodiment, it may be possible that the polysilicon is doped at a later processing step, such as by ion implantation or by some other process such as a diffusion process.

Figure 9:
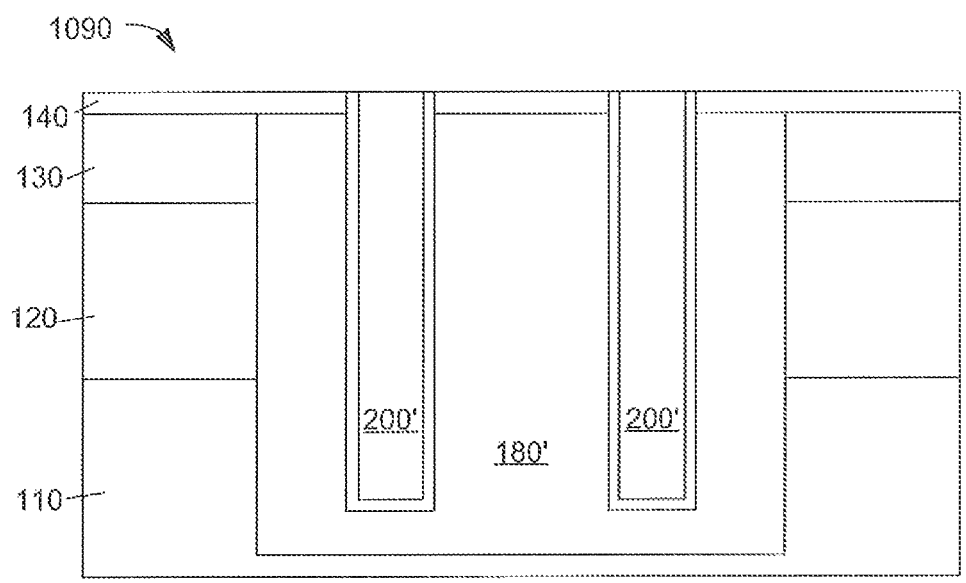

Referring to FIG. 9, a chemical mechanical polishing process (e.g. a CMP process) may then be used to remove a portion of the conductive layer 200 (e.g. that portion which overlies the top surface of dielectric layer 140. The CMP process may be sufficient to convert the conductive layer 200 shown in FIG. 8 into a plurality of spacedly disposed conductive layers 200' shown in FIG. 9 which may be spaced apart (e.g. laterally spaced apart) from each other. As noted above, in another embodiment, it is possible that only a single opening 160 be formed. In such a case, it is possible that only a single conductive layer 200' be formed.

The top surface of each of the conductive layers 200' may be made flush with the top surface of the dielectric layer 140. This forms the structure 1090 shown in FIG. 9. As explained below the conductive layers 200' may be electrically coupled together to form a second electrode (e.g. top electrode) of a capacitor. The capacitor may be a trench capacitor. Hence, a capacitor (for example, a trench capacitor) may be formed having a bottom electrode 180', a top electrode 200' and a capacitor dielectric 190 disposed between the bottom electrode 180' and the top electrode 200'.

Figure 10:
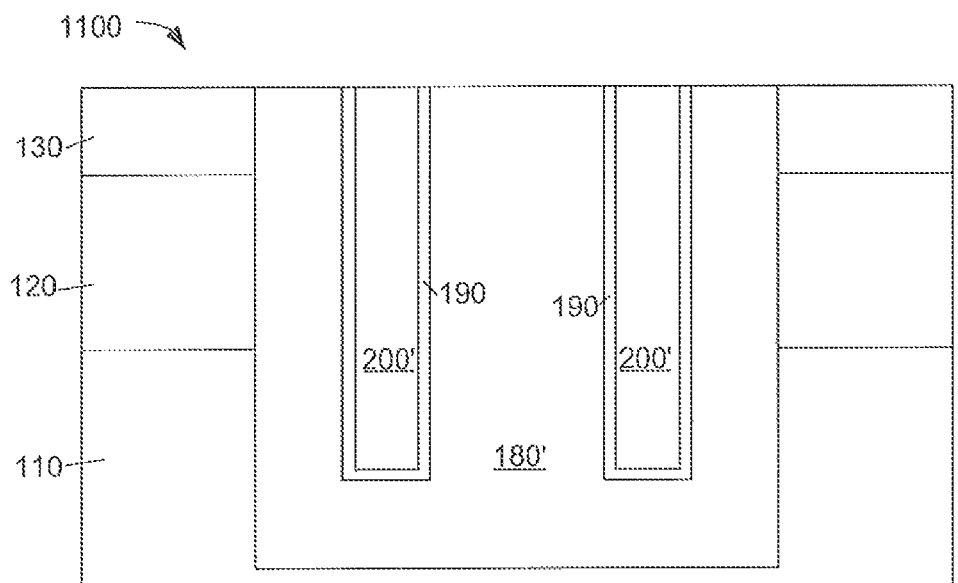

Referring to FIG. 10, the dielectric layer 140 may then be removed from structure 1090 shown in FIG. 9. The dielectric layer 140 may be removed by a wet etching process. This forms the structure 1100 shown in FIG. 10.

Figure 11:
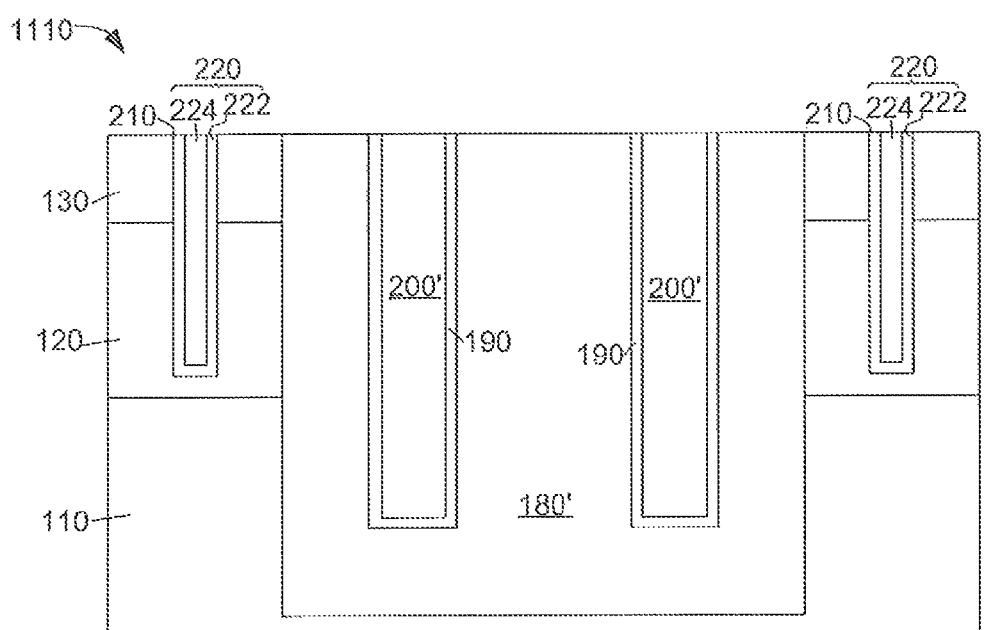

FIG. 11 shows the structure 1110. Referring to FIG. 11, isolation trenches 220 (e.g. deep isolation trenches) may then be formed. Isolation trenches 220 may be formed by first forming trenches 210 (e.g. deep trenches). The trenches 210 may be formed through the layer 130 and within the layer 120. A dielectric layer 222 may then be formed on the sidewalls and bottom surface of the trenches 210. A layer 224 may be formed over the dielectric layer 222 within the trenches 210. The layer 224 may comprise, for example, an undoped polysilicon.

The isolation trenches 220 (e.g. deep isolation trenches) may be formed through the semiconductor layer 130 and in the second semiconductor layer 120. In the embodiment shown, the isolation trenches 220 may be formed so as not go through the semiconductor layer 120. However, in another embodiment, the isolation trenches 220 may pass through the semiconductor layer 120. In an embodiment, the isolation trenches 220 may also be formed in the semiconductor layer 110. In one or more embodiments, the isolation trenches 220 may be formed through the semiconductor layer 120. FIG. 11 shows the structure 1110.

Figure 12:
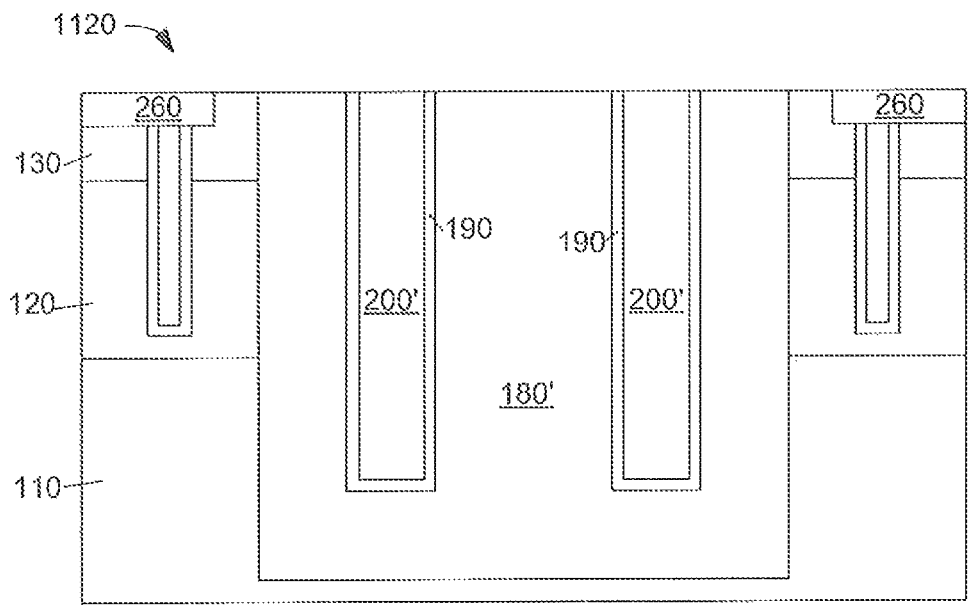

FIG. 12 shows the structure 1120. Referring to FIG. 12, isolation trenches 260 (e.g. shallow isolation trenches) may be formed in the semiconductor layer 130. The isolation trenches 260 may be formed by performing trenches (e.g. shallow trenches) and filling the trenches with a dielectric material such as an oxide. A chemical mechanical polishing process may be used to remove a portion of the dielectric material so that the top surface of each of the isolation trenches 260 may be made flush with the top surface of the doped region 180'.

The structure 1120 includes isolation structures which includes an isolation trench 260 (e.g. a shallow isolation trench) and an isolation trench 220 (e.g. a deep isolation trench) which extends from the bottom surface of the isolation trench 260, through the third semiconductor layer 130 and into the second semiconductor layer 120.

Figure 13:
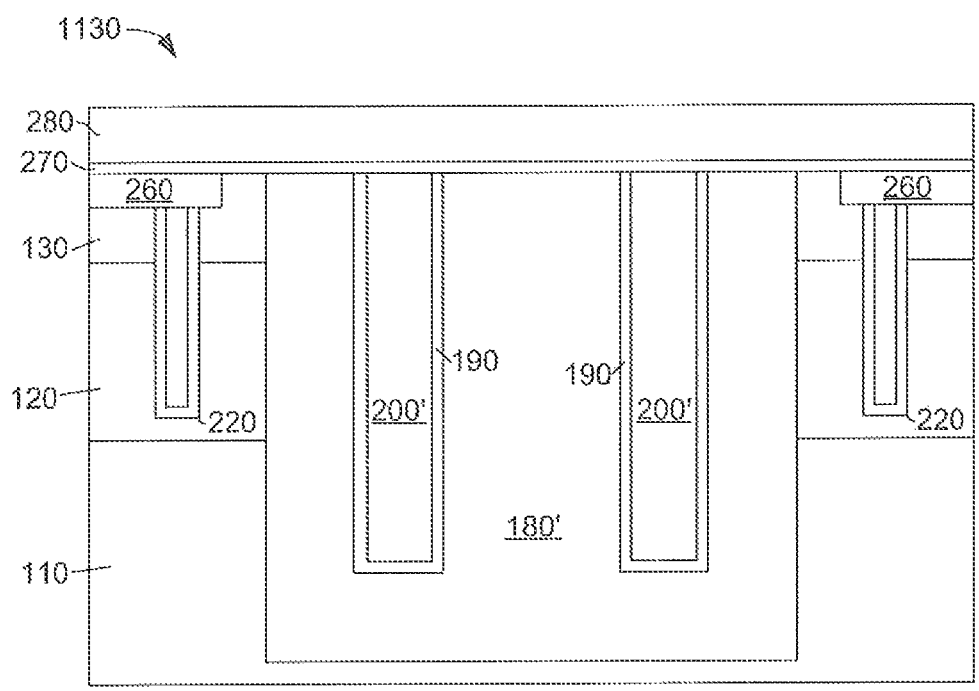

FIG. 13 shows the structure 1130. Referring to FIG. 13, a dielectric layer 270 may then be formed over the structure shown in FIG. 12. The dielectric layer 270 may comprise a dielectric material such as an oxide (for example, a TEOS oxide). A dielectric layer 280 may be formed over the dielectric layer 270. The dielectric layer 280 may comprise a dielectric material such as an oxide (for example, a silicon dioxide). The dielectric layer 280 may comprise BPSG (a boron phosphor silicon glass).

Figure 14:
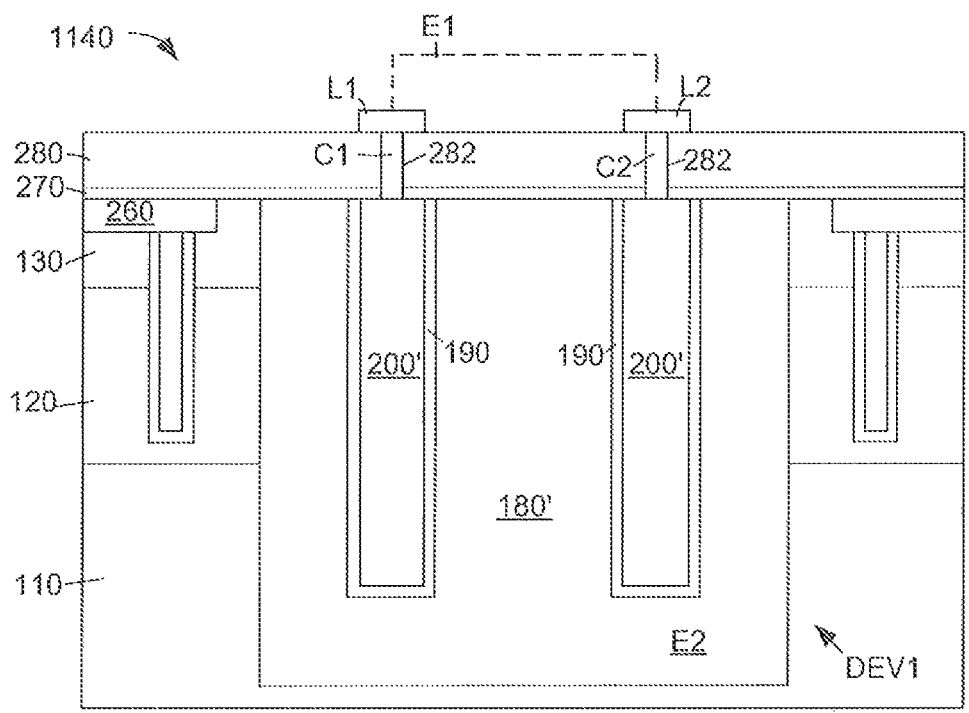

FIG. 14 shows the structure 1140. Referring to FIG. 14, openings 282 may be formed through the dielectric layer 280 as well as through the dielectric layer 270 so as to expose the conductive layers 200'. Conductive contact C1 (e.g. a conductive plug) and conductive contact C2 may be formed within the openings 282. A conductive line L1 (e.g. a metallic line) may be formed over the conductive contact C1. Likewise a conductive line L2 (e.g. a metallic line) may be formed over the conductive contact C2.

Referring to FIG. 14, the structure 1140 comprises a device DEV1 which a capacitor. The capacitor DEV1 includes a first capacitor electrode E1 (e.g. an upper or bottom capacitor electrode), a second capacitor electrode E2 (e.g. a lower or bottom capacitor electrode) and a capacitor dielectric 190 between the first capacitor electrode E1 and the second capacitor electrode E2. The first capacitor electrode E1 (e.g. upper or top electrode) may be formed by electrically coupling together the individual conductive layers 200'. The second capacitor electrode E2 (e.g. lower or bottom electrode) is the doped region 180'. The capacitor dielectric is the dielectric layer 190. As noted above, the dielectric layer 190 (and, hence, capacitor dielectric) may comprise an oxide-nitride-oxide stack of sub-layers. In an embodiment, the second capacitor electrode E2 may be electrically coupled to the first semiconductor layer 110 and may also be electrically coupled to the back side of the stack 110, 120, 130 through the semiconductor layer 110.

The capacitor DEV1 may be referred to as a trench capacitor. It is understood that the capacitor DEV1 may be described as a trench capacitor even though the lateral cross-section of each of the openings 160 (shown in FIG. 2) may have any shape. Hence, it is understood that the device DEV1 may be described as a trench capacitor even though the openings 160 may be formed, for example, as trenches or holes.

In another embodiment, it is possible that the trench capacitor DEV1 may be replaced by any other type of capacitor structure. Generally, any type of capacitor structure may be formed in the layers 110, 120 and 130.

Referring to FIG. 14, it is seen that the device DEV1 may function as a capacitor (e.g. a trench capacitor). The capacitor DEV1 include a bottom electrode E2 which is the doped layer 180'. The bottom electrode E2 (e.g. the doped layer 180') may be electrically coupled to the first semiconductor layer 110. The bottom electrode E2 (e.g. the doped layer 180') may form a conductive pathway through the second semiconductor layer 120 and through the third conductive layer 110. Hence, the bottom electrode E2 (e.g. the doped layer 180') may form a conductive pathway to a front side of the layer stack 110, 120, 130. The front side of the layer stack 110, 120, 130 may correspond to a top surface of the layer 130.

The bottom electrode E2 may thus form a conductive pathway from the layer 110 to a front side of the stack 110, 120, 130 (e.g. to a top surface of the layer 130). As noted, the conductive pathway may be electrical coupled to the layer

110. Likewise, the conductive layer 110 may form a conductive pathway to the back side of the layered stack 110, 120, 130 (which may correspond to the bottom surface of layer 110). Hence, a conductive pathway may be created from the front side of the stack 110, 120, 130 to the back side of the stack 110, 120, 130.

In one or more embodiments, the layer stack 110, 120, 130 may be replaced with any type workpiece. In one or more embodiments, the workpiece may comprise a semiconductor material. In one or more embodiments, the workpiece may be a semicondutor workpiece. In one or more embodiments, the workpiece may be a layer stack including two or more layers. In one or more embodiments, the workpiece may be a layer stack including three or more layers. In one or more embodiments, at least one of the layers (or possibly each of the layers) may be semiconductor layers such as doped semicondutor layers. In one or more embodiments, the bottom electrode E2 (e.g. the doped layer 180') may be electrically coupled to a back side of the workpiece. In one or more embodiments, the bottom electrode E2 may form an electrical pathway (e.g. a conductive pathway) to a front side of the workpiece.

Figure 15:
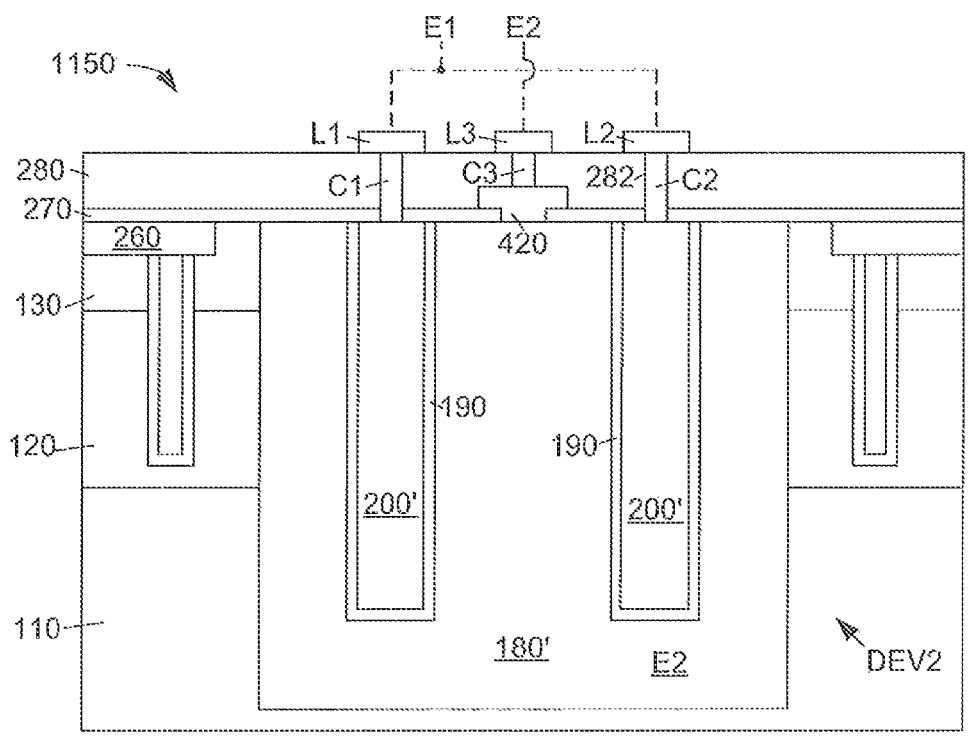
FIG. 15 shows a semiconductor structure in accordance with an embodiment of the present invention.

FIG. 15 shows a structure 1150 which is an embodiment of the invention. FIG. 15 shows that a conductive contact 420 may be formed through the dielectric layer 270 while another conductive contact C3 may electrically couple the conductive contact 420 to the conductive line L3. The structure 1150 includes a device DEV2. The device DEV2 is similar to the device DEV1 shown in FIG. 14 except that the bottom electrode of the capacitor (e.g. trench capacitor) may be reached from the front or top side of the third semiconductor layer 130.

Referring to FIG. 15, openings 282 may be formed and conductive contacts C1 and C2 may be formed in the opening 282 and over the conductive regions 200' (as in FIG. 14). A conductive line (e.g. a metal line) L3 may be formed over the conductive contact C3. A conductive line L1 may be formed over the contact C1 and a conductive line L2 may be formed over the conductive contact C2.

The device DEV2 may also be a capacitor and may also be referred to as a trench capacitor. In this case, the bottom electrode E2 (e.g. the doped region 180') may be electrically coupled to the conductive line L3 through the conductive contacts 420 and C3. The capacitor DEV2 includes a top electrode E1 that may be the conductive layers 200' (which are electrically coupled together).

The discussion above for the device DEV1 of FIG. 14 is also true for the device DEV2. Referring to FIG. 15, it is seen that the bottom electrode E2 (e.g. the doped region 180') may be electrically coupled between the conductive contact 420 and the semiconductor layer 110.

Figure 18:
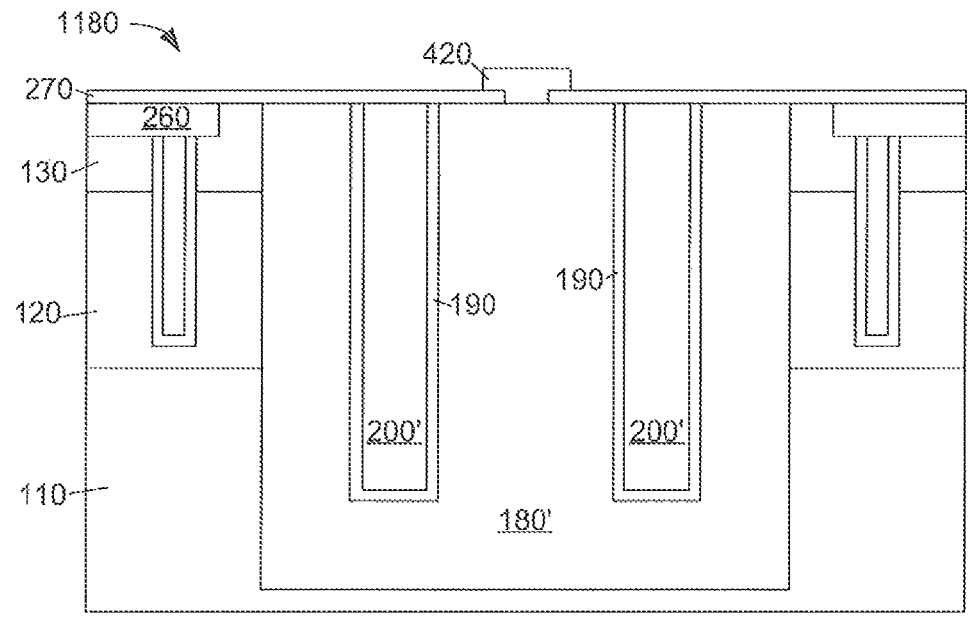
Figure 19:
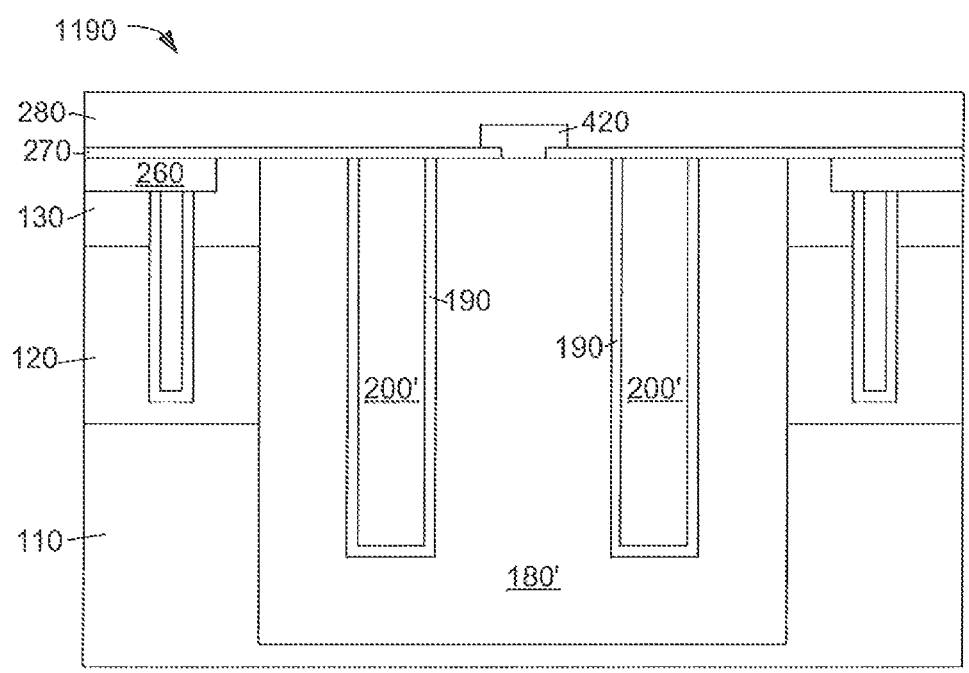
Figure 20:
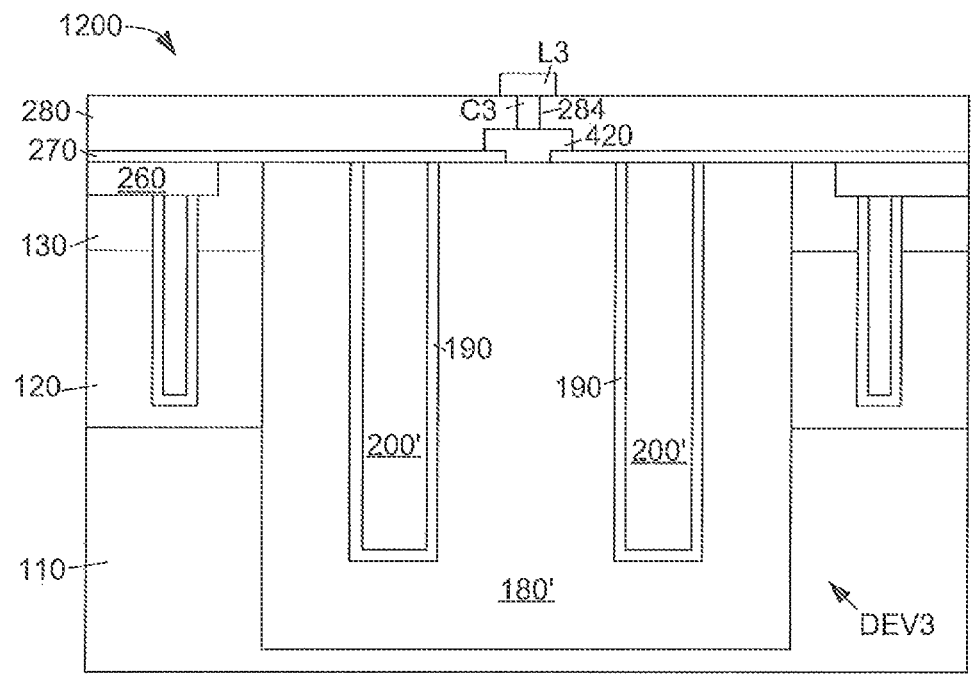

FIG. 16 through FIG. 20 shows a method for making the structure 1200 shown in FIG. 20. The method shown is an embodiment of the invention. Likewise, the structure 1200 shown in FIG. 20 is also an embodiment of the invention.

Figure 16:
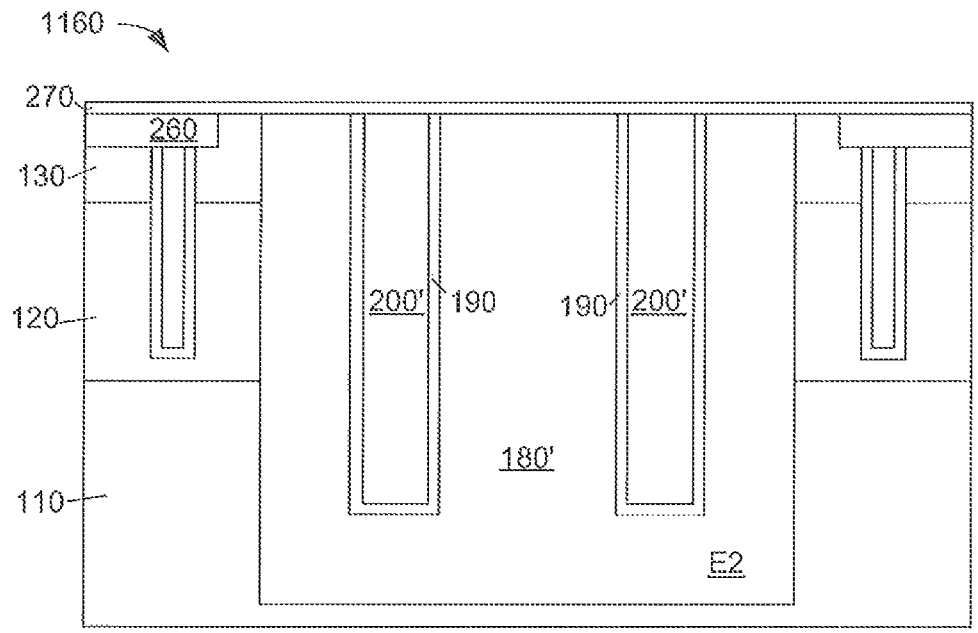
FIGS. 16 through 20 show a method of making a semiconductor structure in accordance with an embodiment of the present invention.

Referring to FIG. 16, the structure 1160 includes the structure 1120 from FIG. 12 which includes a dielectric layer 270. The dielectric layer 270 may, for example, include an oxide such as a silicon dioxide.

Figure 17:
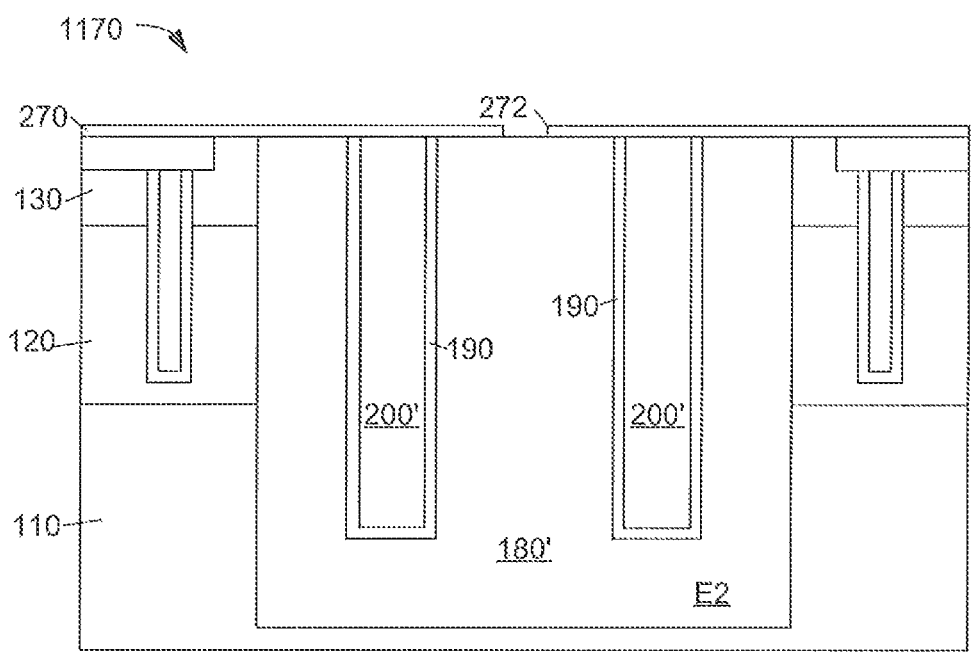

FIG. 17 shows a structure 1170. FIG. 17 shows that an opening 272 may be formed through the dielectric layer 270. In the embodiment shown in FIG. 17, the opening 272 exposes a top surface of the doped region 180'.

FIG. 18 shows a structure 1180. Referring to FIG. 18, a conductive contact 420 is formed in the opening 272 over the doped region 180' so as to form the structure 1170. The conductive contact 420 may, for example, comprise a doped polysilicon (e.g. n-doped or p-doped). The polysilicon may be doped in-situ or may be doped downstream such as by ion implantation or some other process such as a diffusion process. The conductive contact 420 may be electrically coupled to the region 180'.

FIG. 19 shows a structure 1190. Referring to FIG. 19, a dielectric layer 280 may be formed over the conductive contact 420 to form the structure 1190.

FIG. 20 shows a structure 1200. An opening 284 is formed within the dielectric layer 280. A conductive contact C3 may be formed within the opening 284 and over the conductive contact 420. A conductive line L3 (e.g. a metallic line) may formed over the conductive contact C3. The dielectric layer 280 may comprise, for example, an oxide, a nitride and/or an oxynitride.

Referring to FIG. 20, the structure 1200 includes a device DEV3. The device DEV3 may be useful as a conductive sinker. For example, the device DEV3 includes the bottom electrode E2 which corresponds to the doped region 180'. The doped region 180' is electrically coupled to the layer 110. Likewise, the doped region 180' forms a conductive pathway to the front side of the layer stack 110, 120, 130.

In an embodiment, the doped region 180' may electrically couple the front side of the layered stack 110, 120, 130 to the first semiconductor layer 110. The doped region 180' may form a conductive pathway through the third semiconductor layer 130 and through the second semiconductor layer 120. In an embodiment the first semiconductor layer 110 may electrical couple the doped region 180' to the back side of the layer stack 110, 120, 130. The doped region 180' may thus be electrically coupled between the front side and the back side of the layered stack 110, 120, 130.

Figure 21:
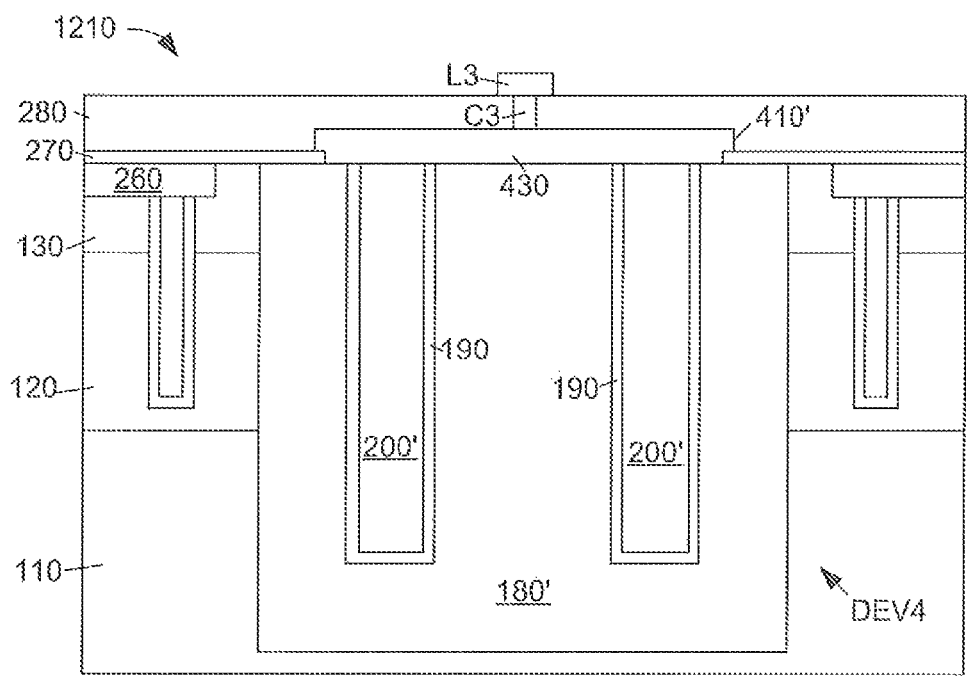
FIG. 21 shows a semiconductor structure in accordance with an embodiment of the present invention.

FIG. 21 shows a structure 1210 which is another embodiment of the invention. FIG. 21 shows the same structure as FIG. 13 which includes a dielectric layer 270. Referring to FIG. 21, an opening 410' is formed through the dielectric layer 270 so as to expose the conductive region 180' as well as each of the conductive layers 200'. A conductive contact 430 is formed over the conductive region 180' as well as the conductive layers 200'. In the embodiment shown, the electrical contact 420 may be electrically coupled to the doped region 180' as well as to each of the conductive layers 200'. The contact 430 may comprise a doped polysilicon (p-doped or n-doped). A conductive contact C3 electrically couples the conductive line L3 to the conductive contact 430.

The device DEV4 shown in FIG. 21 may also serve as a conductive sinker. For example, the device DEV4 includes the bottom electrode F2 which corresponds to the doped region 180'. The doped region 180' is electrically coupled to the layer 110. Likewise, the doped region 180' forms a conductive pathway to the front side of the layer stack 110, 120, 130.

In an embodiment, the doped region 180' may electrically couple the front side of the layered stack 110, 120, 130 to the first semiconductor layer 110. The doped region 180' may form a conductive pathway through the third semiconductor layer 130 and through the second semiconductor layer 120. In an embodiment the first semiconductor layer 110 may electrical couple the doped region 180' to the back side of the layer stack 110, 120, 130. The doped region 180' may thus be electrically coupled between the front side and the back side of the layered stack 110, 120, 130.

An embodiment of the invention may be a semiconductor structure, comprising: a first semiconductor layer; a second semiconductor layer overlying the first semiconductor layer; a third semiconductor layer overlying the second semiconductor layer; and a capacitor disposed in the first, the second and the third semicondutor layers, the capacitor including a bottom electrode electrically coupled to the first semiconductor layer. In an embodiment, the capacitor may be a trench capacitor.

An embodiment of the invention may be semiconductor structure, comprising: a first semiconductor layer; a second semiconductor layer overlying the first semiconductor layer; a third semiconductor layer overlying the second semiconductor layer; an opening formed in the first, the second and the third semiconductor layer; a conductive region disposed within the first, the second and the third semiconductor layers, the conductive region bordering a sidewall and bottom of the opening, the conductive region electrically coupled to the first semiconductor layer; a dielectric layer disposed within the opening and over the conductive region; and a conductive layer disposed over the dielectric layer within the opening.

An embodiment of the invention may be a semiconductor structure, comprising; a workpiece having a front side and a back side; and a capacitor disposed in the workpiece, the capacitor including an electrode electrically coupled to a back side of the workpiece. In an embodiment, the electrode may be a bottom electrode. In an embodiment, the capacitor may be a trench capacitor.

An embodiment of the invention may be a semiconductor structure, comprising; a layer stack including at least a second layer over a first layer; and a capacitor disposed in the stack, the capacitor including a bottom electrode electrically coupled to the first layer. In an embodiment, the capacitor may be a trench capacitor.

An embodiment of the invention may be a semiconductor device, comprising: a layer stack including at least a second layer over a first layer; and a trench capacitor disposed in the layer stack, the capacitor having a bottom electrode forming a conductive pathway between the first layer and a top surface of the second layer. In an embodiment, the capacitor may be a trench capacitor.

An embodiment of the invention may be a method of forming a semiconductor structure, comprising: forming a first semiconductor layer; forming a second semiconductor layer over the first semiconductor layer; forming a third semiconductor layer over the second semiconductor layer; forming an opening in the first, second and third semiconductor layers; forming a conductive region within the first, the and third semiconductor layer, the conductive region surrounding the opening, the conductive region being electrically coupled to the first semiconductor layer; forming a dielectric layer in the opening and over the conductive region; and forming a conductive layer over the dielectric layer in the opening.

An embodiment of the invention may be a semiconductor structure, comprising: a layer stack including a second layer over a first layer; and a capacitor disposed in stack and electrically coupled to said first layer. In one or more embodiments, the capacitor may be a trench capacitor.

Although the invention has been described in terms of certain embodiments, it will be obvious to those skilled in the art that many alterations and modifications may be made without departing from the invention. Accordingly, it is intended that al such alterations and modifications be included within the spirit and scope of the invention.

What is claimed is:

1. A semiconductor structure, comprising:
a first semiconductor layer, said first semiconductor layer being a semiconductor substrate;
a second semiconductor layer overlying said first semiconductor layer, said second semiconductor layer being an epitaxial layer;
a third semiconductor layer overlying said second semiconductor layer, said third semiconductor layer being an epitaxial layer; and
a capacitor disposed in said first, said second and said third semicondutor layers, said capacitor including a bottom electrode electrically coupled to said first semiconductor layer.

2. The structure of claim 1, wherein said bottom electrode is an electrical pathway through said second and third semiconductor layers.

3. The structure of claim 1, wherein said first semiconductor layer includes a dopant of a first conductivity type, said second semiconductor layer includes a dopant of said first conductivity type, said third semiconductor material includes a dopant of a second conductivity type opposite said first conductivity type.

4. The structure of claim 3, wherein said first conductivity type is p-type and said second conductivity type is n-type.

5. The structure of claim 3, wherein a concentration of said dopant of said first semiconductor layer is higher than a concentration of said dopant of said second semiconductor layer.

6. The structure of claim 1, wherein said bottom electrode extends to a top surface of said third semiconductor layer.

7. The structure of claim 1, wherein said capacitor is a trench capacitor.

8. A semiconductor structure, comprising:
a first semiconductor layer, said first semiconductor layer being a semiconductor substrate;
a second semiconductor layer overlying said first semiconductor layer, said second semiconductor layer being an epitaxial layer;
a third semiconductor layer overlying said second semiconductor layer, said third semiconductor layer being an epitaxial layer;
an opening formed in said first, said second and said third semiconductor layer;
a conductive region disposed within said first, said second and said third semiconductor layers, said conductive region bordering a sidewall and bottom of said opening, said conductive region electrically coupled to said first semiconductor layer;
a dielectric layer disposed within said opening and over said conductive region; and
a conductive layer disposed over said dielectric layer within said opening.

9. The structure of claim 8, wherein said conductive region is a doped region.

10. The structure of claim 8, wherein said conductive region is a conductive pathway through said second and said third semiconductor layers.

11. The structure of claim 8, wherein said conductive region extends to a top surface of said third semiconductor layer.

12. The structure of claim 8, wherein said opening is one of a plurality of laterally spaced apart openings, said dielectric layer is one of a plurality of dielectric layers in which each dielectric layer is disposed in a respective opening, said conductive layer is one of a plurality of conductive layers in which each conductive layer is disposed over a respective dielectric layer.

13. The structure of claim 8, wherein said conductive region, said dielectric layer and said conductive layer form a trench capacitor.

14. A semiconductor structure, comprising:
a layer stack including a first layer, a second layer over said first layer, and a third layer over said second layer, wherein said first layer is a first doped semiconductor layer with a dopant of a first conductivity type, said second layer is a second doped semiconductor layer with a dopant of said first conductivity type and said third layer is a third doped semiconductor layer with a dopant of a second conductivity type opposite to that of the said first conductivity type;
and
a capacitor disposed in said stack and electrically coupled to said first layer.

15. The structure of claim 14, wherein said capacitor electrically couples said first layer to a front side of said stack.

16. The structure of claim 14, wherein said capacitor forms a conductive pathway from said first layer to a front side of said stack.

17. The structure of claim 14, wherein said capacitor forms an electrical pathway from said first layer to a front side of said stack.

18. The structure of claim 14, wherein said capacitor is a trench capacitor.

* * * * *